(12) United States Patent
Otremba et al.

(10) Patent No.: US 7,701,065 B2
(45) Date of Patent: Apr. 20, 2010

(54) DEVICE INCLUDING A SEMICONDUCTOR CHIP HAVING A PLURALITY OF ELECTRODES

(75) Inventors: Ralf Otremba, Kaufbeuren (DE); Xaver Schloegel, Sachsenkam (DE); Klaus Schiess, Allensbach (DE); Tien Lai Tan, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 236 days.

(21) Appl. No.: 11/925,281

(22) Filed: Oct. 26, 2007

(65) Prior Publication Data

US 2009/0108460 A1    Apr. 30, 2009

(51) Int. Cl.
*H01L 29/41* (2006.01)
(52) U.S. Cl. .............................. 257/776; 257/E23.011
(58) Field of Classification Search ................. 257/774, 257/E23.011, 776
See application file for complete search history.

(56) References Cited

U.S. PATENT DOCUMENTS

| | | | |
|---|---|---|---|
| 6,133,634 A | 10/2000 | Joshi | |
| 6,582,990 B2 | 6/2003 | Standing | |
| 6,624,522 B2 | 9/2003 | Standing et al. | |
| 6,677,669 B2 | 1/2004 | Standing | |
| 6,683,339 B2* | 1/2004 | Suh | 257/296 |
| 6,740,930 B2 | 5/2004 | Mattei et al. | |
| 6,767,820 B2 | 7/2004 | Standing et al. | |
| 6,890,845 B2 | 5/2005 | Standing et al. | |
| 2005/0077583 A1 | 4/2005 | Disney et al. | |
| 2005/0101054 A1* | 5/2005 | Mastromatteo et al. | 438/106 |
| 2005/0104219 A1* | 5/2005 | Matsui | 257/774 |
| 2006/0076647 A1 | 4/2006 | Naethe et al. | |
| 2006/0231928 A1* | 10/2006 | Dotta et al. | 257/621 |
| 2007/0152338 A1* | 7/2007 | Kim | 257/758 |

OTHER PUBLICATIONS

"Lateral Power MOSFET for Megahertz-Frequency, High-Density DC/DC Converters", Z. John Shen, et al., IEEE Transactions on Power Electronics, vol. 21, No. 1, Jan. 2006.

* cited by examiner

*Primary Examiner*—Allan R. Wilson
(74) *Attorney, Agent, or Firm*—Dicke, Billig & Czaja, PLLC (57) ABSTRACT

A device, including a semiconductor chip having a plurality of first electrodes is disclosed. A plurality of second electrodes is arranged on a first surface of the semiconductor chip. A first electrically conductive layer is applied over a first section of the first surface and electrically coupled to the first electrodes arranged within the first section. A second electrically conductive layer is applied over the first electrically conductive layer and electrically coupled to the second electrodes arranged within the first section.

17 Claims, 10 Drawing Sheets

DEVICE INCLUDING A SEMICONDUCTOR CHIP HAVING A PLURALITY OF ELECTRODES

BACKGROUND

This invention relates to a device that includes a semiconductor chip having a plurality of electrodes on one of its surfaces and a method of assembling thereof.

Power semiconductor chips may have a plurality of electrodes on one surface. Power semiconductor chips are suitable, for the switching or control of currents and/or voltages. Power semiconductor chips may, for example, be configured as power transistors, power diodes or IGBTs (Insulated Gate Bipolar Transistors).

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Devices with semiconductor chips are described below. The semiconductor chips may be of extremely different types and may include, for example, integrated electrical or electro-optical circuits. The semiconductor chips may, for example, be configured as power MOSFETs, such as power transistors, power diodes or IGBTs (Insulated Gate Bipolar Transistors). Furthermore, the semiconductor chips may include control circuits, microprocessors or microelectromechanical components. In one embodiment, semiconductor chips of lateral type may be involved, which are fabricated in such a way that electric currents can flow in a direction substantially parallel to the main surfaces of the semiconductor chips. In a semiconductor chip having a lateral structure, the electrodes through which the current is conducted are arranged on only one main surface of the semiconductor chip. In contrast to this, a semiconductor chip having a vertical structure has electrodes on its two main surfaces, that is to say on its top side and bottom side. In one embodiment, power transistors, power diodes and IGBTs may have a lateral structure. By way of example, the source and drain electrodes of a power transistor, the anode and cathode electrodes of a power diode and the emitter and collector electrodes of an IGBT may be situated on the same main surface of the respective power semiconductor chip.

Furthermore, a plurality of electrodes of the same type may be arranged on one surface of the semiconductor chip. For example, a lateral power transistor chip may have a plurality of electrodes of the source type and a plurality of electrodes of the drain type arranged on the same surface. In this case, the power transistor chip includes a plurality of transistors, wherein each source electrode and each drain electrode belong to one of the transistors.

The devices described below may include integrated circuits to control other integrated circuits, for example, the integrated circuits of power transistors, power diodes or IGBTs. The semiconductor chips need not be manufactured from specific semiconductor material and, furthermore, may contain inorganic and/or organic materials that are not semiconductors, such as for example insulators, plastics or metals. Moreover, the semiconductor chips may be packaged or unpackaged.

The semiconductor chips have electrodes (or contact pads) which allow electrical contact to be made with the semiconductor chips. The electrodes may be composed of any desired electrically conductive material, for example of a metal, such as copper, aluminum or gold, a metal alloy or an electrically conductive organic material.

One or more electrically conductive layers may be applied to the semiconductor chips. The electrically conductive layers may be used to make electrical contact with the semiconductor chips from outside the devices and to make electrical connections among the electrodes of the semiconductor chips. The electrically conductive layers may be manufactured with any desired geometric shape and any desired material composition. The electrically conductive layers may, for example, be in the form of a layer covering an area. Any desired electrically conductive materials, such as metals, for example aluminum, gold or copper, metal alloys or organic conductors, may be used as the material. The electrically conductive layers need not be homogenous or manufactured from just one material, that is to say various compositions and concentrations of the materials contained in the electrically conductive layers are possible. Furthermore, the electrically conductive layers may be arranged above or below or between dielectric layers.

The devices described below include external contact elements. The external contact elements are accessible from outside the device and allow electrical contact to be made with the semiconductor chip from outside the device. Furthermore, the external contact elements may be thermally conductive and may serve as heat sinks for dissipating the heat generated by the semiconductor chips. The external contact elements may be composed of any desired electrically conductive material, for example of a metal, such as copper, aluminum or gold, a metal alloy or an electrically conductive organic material. For example, a surface of any electrically conductive layer may form an external contact element. The external contact elements or surfaces of them may also form assembly planes to mount the device onto another element or to mount another element onto the device.

The devices may further include electrically insulating layers. The electrically insulating layers may insulate electrically conductive layers from each other or from electrodes of the device.

Figure 1A:
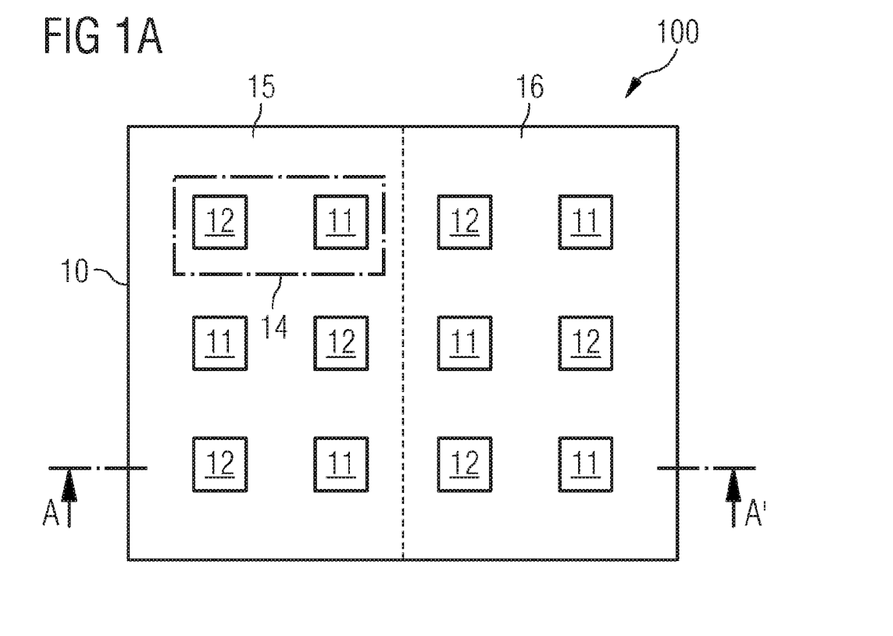
FIGS. 1A to 1C schematically illustrate a device according to an exemplary embodiment.
Figure 1B:
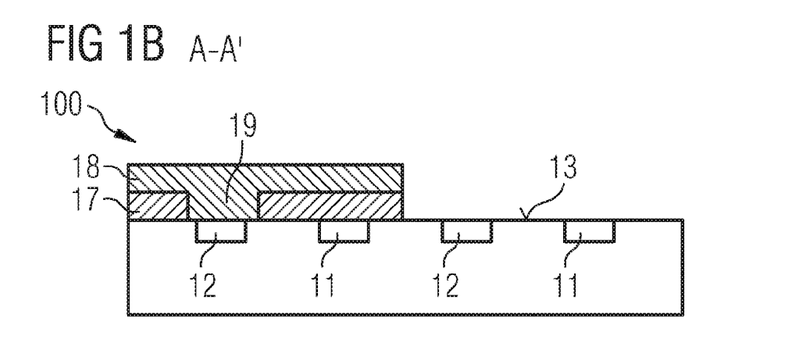

FIG. 1A schematically illustrates a device 100 in a plan view as an exemplary embodiment. FIG. 1B illustrates the device 100 in cross section along the line A-A' depicted in FIG. 1A. The device 100 includes a semiconductor chip 10 having a plurality of first electrodes 11 and a plurality of second electrodes 12 arranged on a first surface 13 of the semiconductor chip 10. The first electrodes 11 may be of the same type and the second electrodes may be of the same type.

The semiconductor chip 10 may be a power semiconductor, for example a power transistor or a power diode or an IGBT. Furthermore, the semiconductor chip 10 may have a lateral structure. If the semiconductor chip 10 is a power transistor, the first electrodes 11 may be source electrodes and the second electrodes 12 may be drain electrodes. If the semiconductor chip 10 is a power diode, the first electrodes 11 may be cathode electrodes and the second electrodes 12 may be anode electrodes. If the semiconductor chip 10 is an IGBT, the first electrodes 11 may be emitter electrodes and the second electrodes 12 may be collector electrodes. The semiconductor chip 10 may consist of a plurality of transistors, diodes or IGBT. In this case, a pair of a first electrode 11 and a second electrode 12 form one transistor, diode or IGBT. In FIG. 1A an example of such a single component is given by the two electrodes 11 and 12 surrounded by a dashed line 14.

The first surface 13 of the semiconductor chip 10, on which the first and second electrodes 11 and 12 are arranged, may be notionally divided into two or more sections. In FIG. 1A a notional division of the first surface 13 into a first section 15 and a second section 16 is illustrated. In the present example, each of the two sections 15 and 16 includes three first electrodes 11 and three second electrodes, respectively. The first surface 13 may also be notionally divided into other sections containing any number of electrodes 11 and 12.

As illustrated in FIG. 1B a first electrically conductive layer 17 is applied over the first section 15. The first electrically conductive layer 17 is electrically coupled to the three first electrodes 11 arranged within the first section 15. On top of the first electrically conductive layer 17 a second electrically conductive layer 18 is deposited, which is electrically coupled to the three second electrodes 12 arranged within the first section 15.

In order to electrically couple the second electrically conductive layer 18 to the second electrodes 12, through-holes 19 may be integrated into the first electrically conductive layer 17. The second electrically conductive layer 18 may be connected to the second electrodes 12 via the through-holes 19.

Figure 1C:
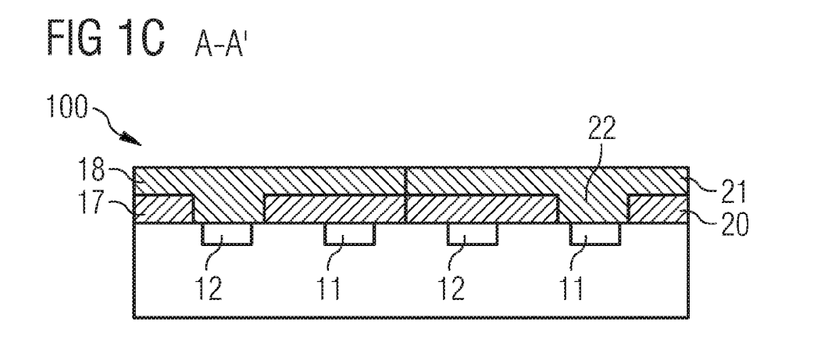

According to one embodiment, a third electrically conductive layer 20 may be applied over the second section 16 of the first surface 13 as illustrated in FIG. 1C. The third electrically conductive layer 20 may be electrically coupled to the second electrodes 12 arranged within the second section 16. A fourth electrically conductive layer 21 may be applied over the third electrically conductive layer 20. The fourth electrically conductive layer 21 may be electrically coupled to the first electrodes 11 arranged within the second section 16, for example via through-holes 22 integrated in the third electrically conductive layer 20.

It may be provided that the first electrically conductive layer 17 is electrically coupled to the fourth electrically conductive layer 21. Furthermore, the second electrically conductive layer 18 may be electrically coupled to the third electrically conductive layer 20. This arrangement makes it possible to electrically contact all first electrodes 11 via the fourth electrically conductive layer 21 and all second electrodes 12 via the second electrically conductive layer 18.

According to a further embodiment, the second electrically conductive layer 18 may cover both the first electrodes 11 and the second electrodes 12 of the first section 15, but is electrically coupled only to the second electrodes 12 of the first section 15. The fourth electrically conductive layer 21 may cover both the first electrodes 11 and the second electrodes 12 of the second section 16, but is electrically coupled only to the first electrodes 11 of the second section 16.

Figure 2A:
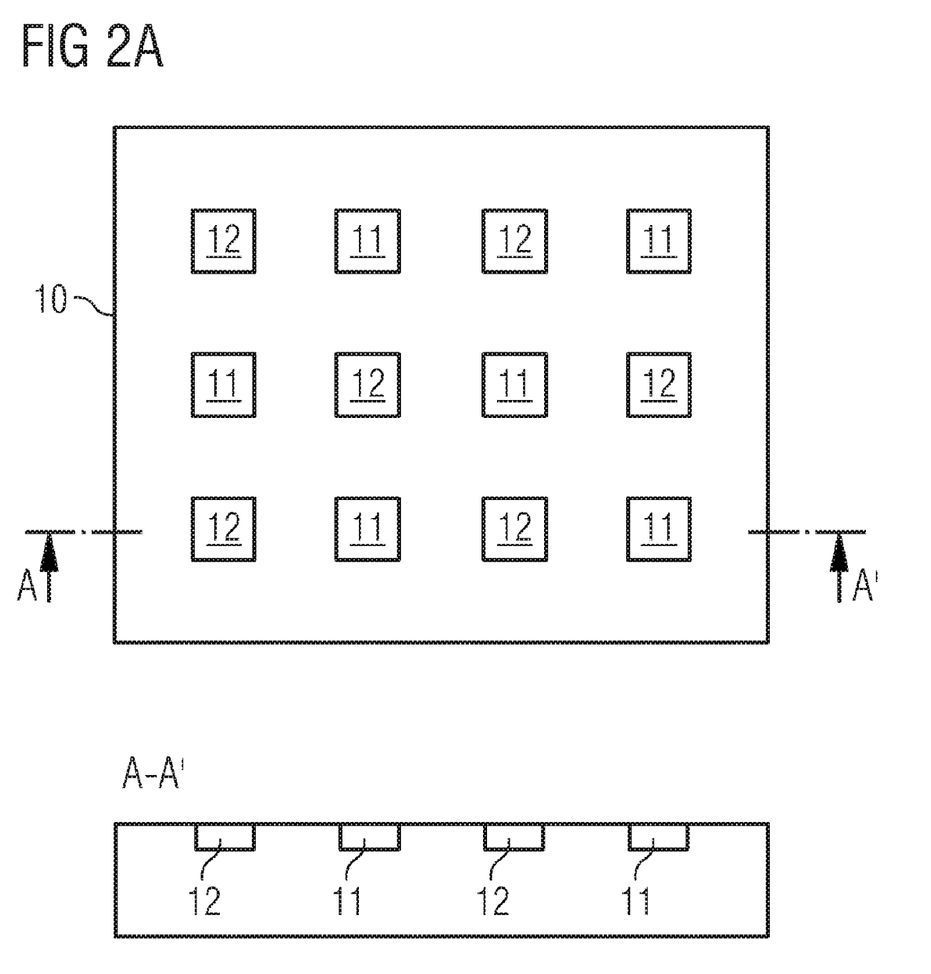
FIGS. 2A to 2F schematically illustrate an exemplary embodiment of a method to fabricate a device 200.
Figure 2B:
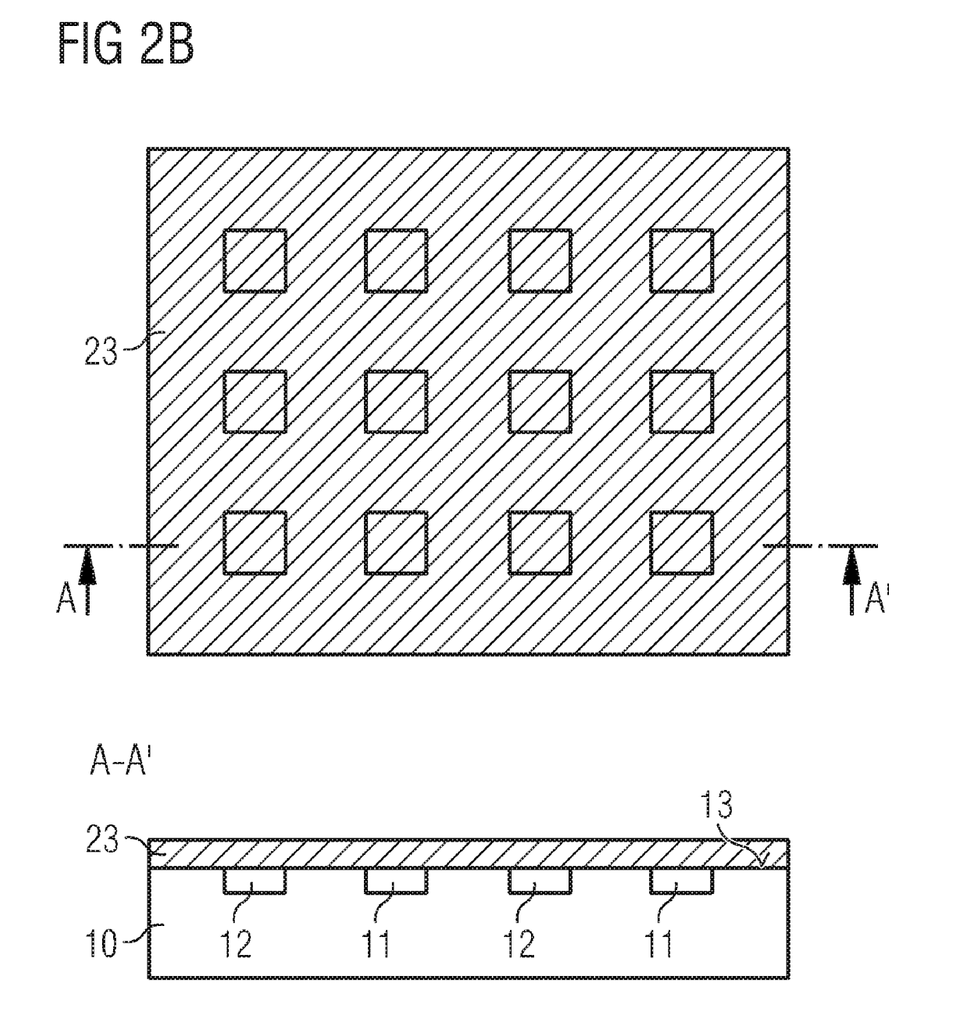
Figure 2C:
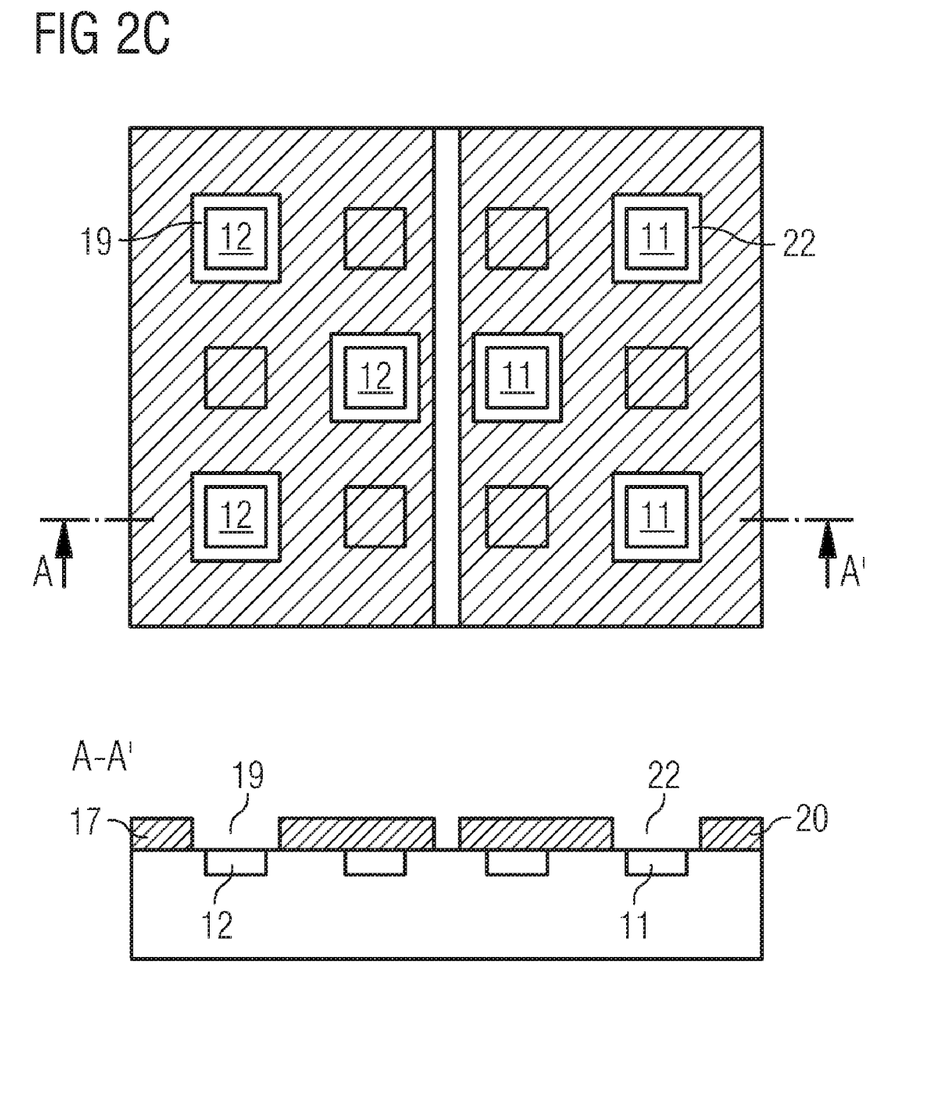
Figure 2D:
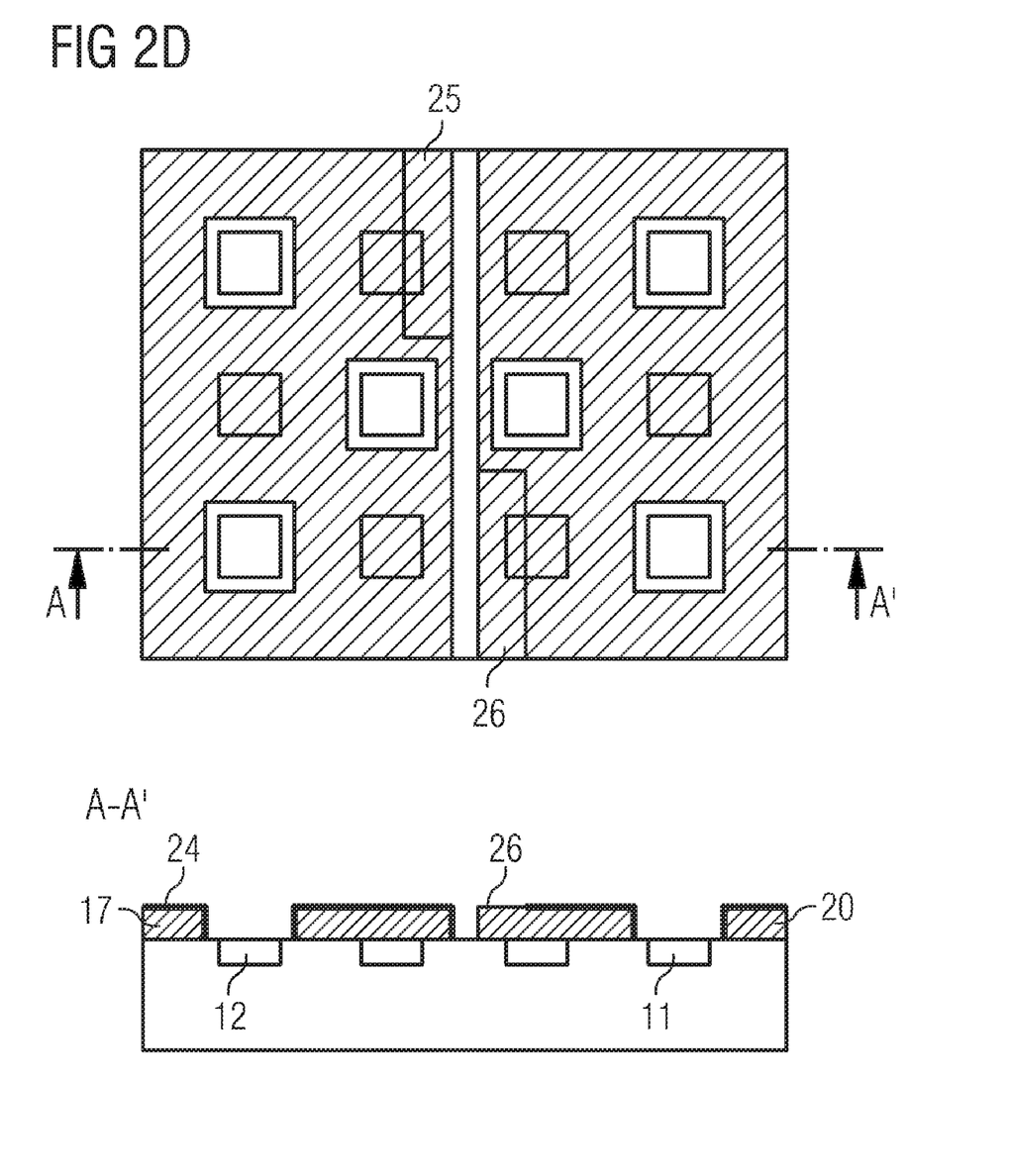
Figure 2E:
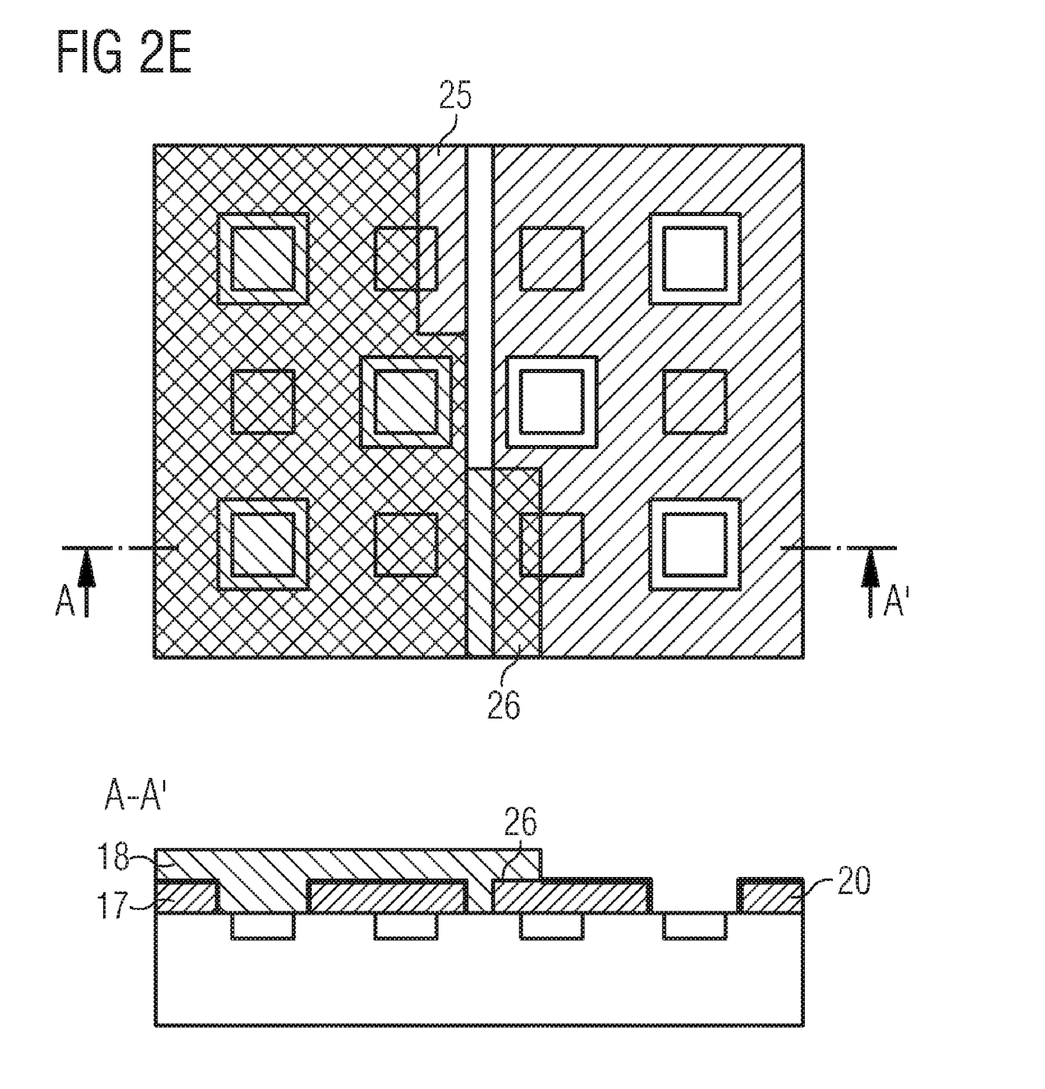
Figure 2F:
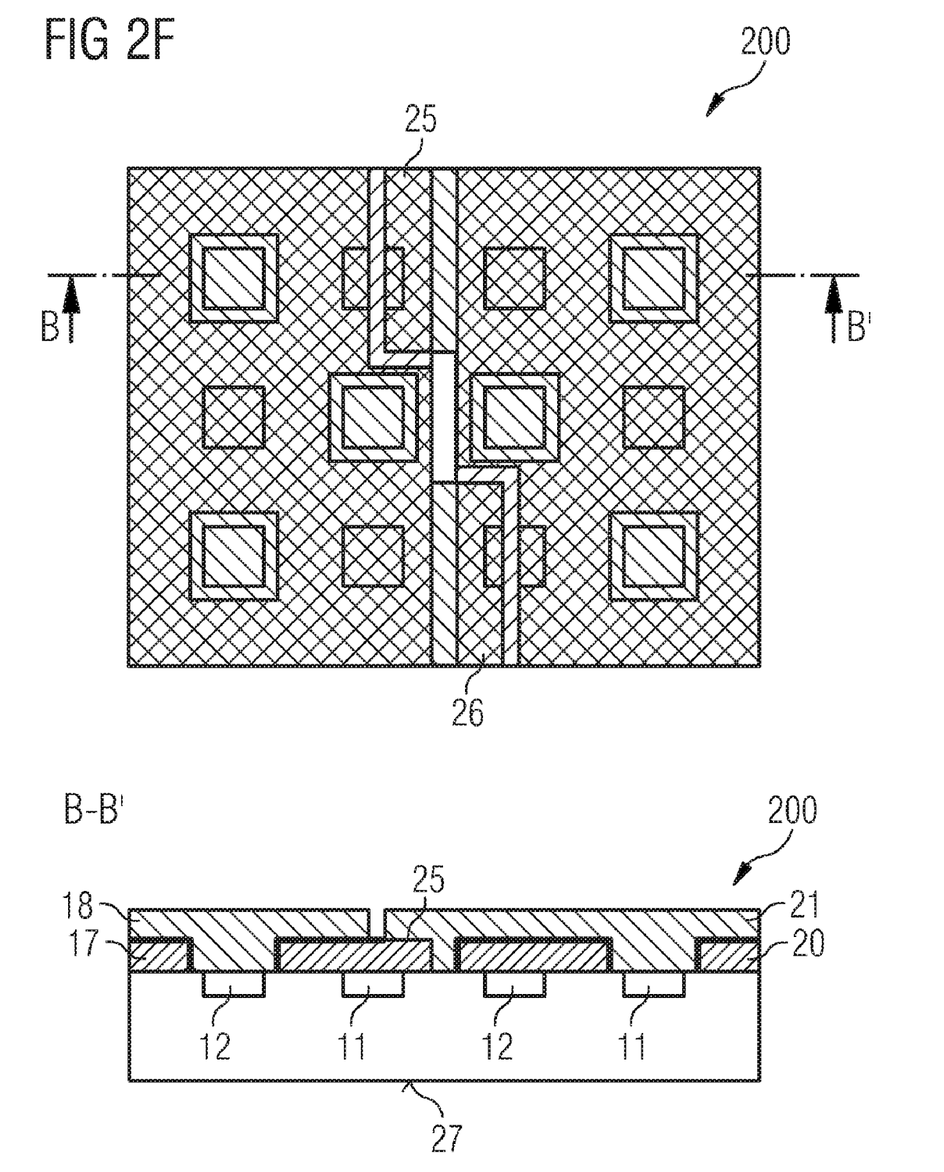

In FIGS. 2A to 2F different stages of the fabrication of a device 200, which is illustrated in FIG. 2F, are exemplarily illustrated. The device 200 is an implementation of the device 100 illustrated in FIGS. 1A to 1C. The details of the fabrication method as well as the features of the device 200 that are described below can therefore be likewise applied to the device 100.

The semiconductor chip 10 is provided, which is illustrated in FIG. 2A in a plan view (top) and in cross section along the line A-A' (bottom). The semiconductor chip 10 contains first electrodes 11 and second electrodes 12 on its first surface 13. It may be provided that the semiconductor chip 10 is a part of a semiconductor wafer which contains a plurality of integrated circuits and which has not been singulated into individual semiconductor chips yet. But the semiconductor chip 10 may also be a single semiconductor chip which has been singulated from the wafer bond.

A metallization layer 23 may be deposited onto the first surface 13 of the semiconductor chip 10 (see FIG. 2B). The metallization layer 23 may include a seed layer and a further layer which is galvanically deposited onto the seed layer. An electroless deposition method may be used to produce the seed layer. The seed layer may have a thickness of up to 1 µm and may, for example, be made of zinc. The electrical conductivity of the seed layer may be used to galvanically deposit an electrically conductive layer, for example a copper layer, on the seed layer. The copper layer may have a thickness of up to 200 µm and may, in one embodiment, be in the range between 50 µm and 100 µm. As an alternative to the electroless and galvanic deposition of the metallization layer 23, other deposition methods, such as physical vapor deposition, chemical vapor deposition, sputtering, spin-on processes, spray deposition or ink jet printing, may be employed.

After its deposition the metallization layer 23 may be structured as illustrated in FIG. 2C. The structuring may be carried out such that the metallization layer 23 is split into two electrically conductive layers separated from each other. These two electrically conductive layers may be the electrically conductive layers 17 and 20, which have previously been illustrated in FIGS. 1B and 1C. Furthermore, the through-holes 19 may be integrated into the electrically conductive layer 17 in the area of the second electrodes 12. In the electrically conductive layer 20, the through-holes 22 may be integrated such that the first electrodes 11 are laid open. The structuring of the metallization layer 23 may be carried out, for example, by using photolithografic methods or other suitable techniques.

The top surfaces of the electrically conductive layers 17 and 20 and the exposed parts of the semiconductor chip 10 may then be coated with an electrically insulating dielectric layer 24, for example a photoresist layer or a silicon nitride layer (see FIG. 2D). For the deposition of the dielectric layer 24 physical or chemical vapor deposition, spraying or spin coating or a squeegee technique or other appropriate methods may be used. The dielectric layer 24 may have a thickness of up to 10 µm. The dielectric layer 24 is then structured, for example by using photolithographic methods. The dielectric layer 24 is structured such that the electrodes 11 and 12, on which previously the through-holes 19 and 22 had been formed, are laid open. Furthermore, the dielectric layer 24 may be removed in a section 25 of the electrically conductive layer 17 and a section 26 of the electrically conductive layer 20 as illustrated in FIG. 2D.

In a further fabrication process, the electrically conductive layer 18 is deposited on top of the semiconductor chip 10 by using similar techniques as for the deposition of the metallization layer 23 (see FIG. 2E). The electrically conductive layer 18 may be deposited and structured such that it covers the electrically conductive layer 17 and the section 26 of the electrically conductive layer 20, but leaves the section 25 of the electrically conductive layer 17 and the electrically conductive layer 20 with the exception of the section 26 uncovered.

The electrically conductive layer 21 may be deposited on top of the semiconductor chip 21 and structured such that the electrically conductive layer 21 is electrically insulated from the electrically conductive layer 18, but covers the section 25 of the electrically conductive layer 17 as illustrated in FIG. 2F, in which a cross section along the line B-B' is illustrated. The electrically conductive layers 18 and 21 may also be fabricated in the same fabrication process.

If the semiconductor chip 10 is part of a semiconductor wafer, which has not been singulated into individual semiconductor chips yet, the semiconductor wafer may be diced thereby separating individual devices 200.

Due to the deposition and structuring of the electrically conductive layers 17, 18, 20 and 21 and the dielectric layer 24, the electrically conductive layers 17 and 21 are electrically connected to each other via the section 25. Furthermore, the electrically conductive layers 18 and 20 are electrically connected to each other via the section 26, but are electrically insulated from the electrically conductive layers 17 and 21. This arrangement makes it possible to electrically contact all first electrodes 11 via the electrically conductive layer 21 and all second electrodes 12 via the electrically conductive layer 18. Thus, the individual power transistors, power diodes or IGBTs of the semiconductor chip 10 are connected in parallel. The individual electrodes 11 and 12 are not addressed separately via their relatively small contact pads but can be addressed over contact pads having a much larger surface. Each top surface of the electrically conductive layers 18 and 21, which is uncovered and may be used for electrical connections, may, for example, have a surface area of at least 1 mm$^2$ or 2 mm$^2$ or 10 mm$^2$ or 20 mm$^2$ or 50 mm$^2$.

The top surfaces of the electrically conductive layers 18 and 21 forming the external contact surfaces may be used to electrically couple the device 200 to other components. For example, the device may be mounted onto a circuit board, for example a PCB (Printed Circuit Board), in a flip-chip manner and the electrical connections between the circuit board and the electrically conductive layers 18 and 21 may be established by solder deposits. Furthermore, the electrically conductive layers 18 and 21 may be connected to other components via bond-wires or by using other suitable connection techniques.

On the second surface 27 opposite of the first surface 13 of the semiconductor chip 10, a heat sink or cooling element may be attached. The heat sink or cooling element may dissipate the heat generated by the semiconductor chip 10.

The device 200 does not necessarily contain a carrier such as a leadframe. Furthermore, the device 200 may not contain any mold material encapsulating components of the device 200.

Figure 3:
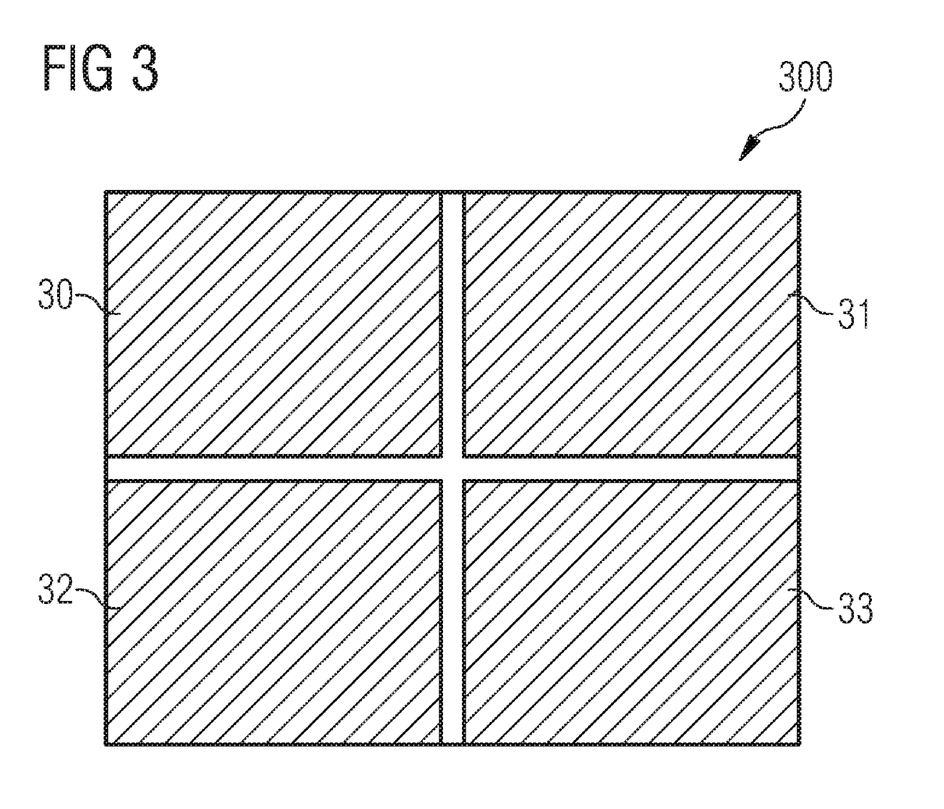
FIG. 3 schematically illustrates a device according to an exemplary embodiment.

Device 200 illustrated in FIG. 2F is only intended to be an exemplary embodiment, and many variations are possible. For example, the geometries of the electrically conductive layers 17, 18, 20 and 21 may be varied and also the techniques as to electrically couple two of the electrically conductive layers with each other. Furthermore, there may be more than two electrically conductive layers via which the electrodes 11 and 12 can be contacted. An example of such an arrangement is illustrated in FIG. 3. The device 300 illustrated in FIG. 3 has four electrically conductive layers 30 to 33 arranged such that they can be contacted from outside of the device 300. For example, the electrically conductive layer 30 may be electrically coupled to some of the first electrodes 11, and the remaining first electrodes 11 may be electrically coupled to the electrically conductive layer 33. The electrically conductive layer 31 may be electrically coupled to some of the second electrodes 12, and the remaining second electrodes 12 may be electrically coupled to the electrically conductive layer 32.

Figure 4:
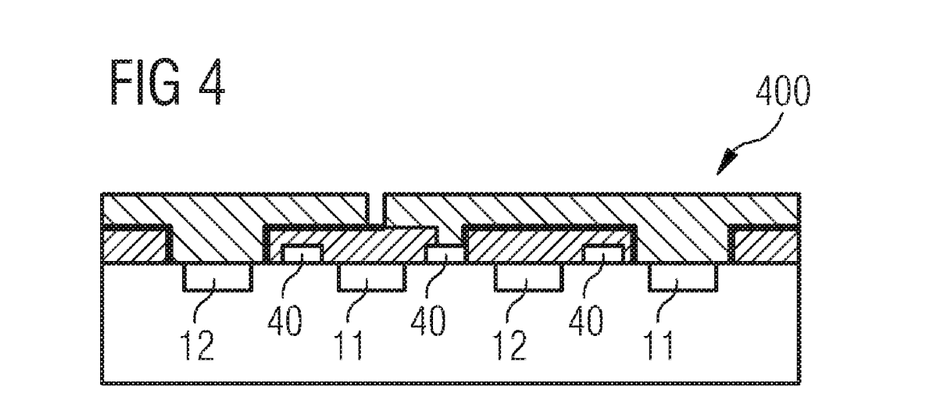
FIG. 4 schematically illustrates a device according to an exemplary embodiment.

In case of the semiconductor chip 10 being a power transistor or an IGBT, drain electrodes may be arranged on the first surface 13 of the semiconductor chip 10. As illustrated in FIG. 4, the gate electrodes may be implemented as gate fingers 40 between the columns of the electrodes 11 and 12. The gate fingers 40 may be electrically coupled to an external contact pad which allows to address the gate electrodes from outside the device 400.

Figure 5A:
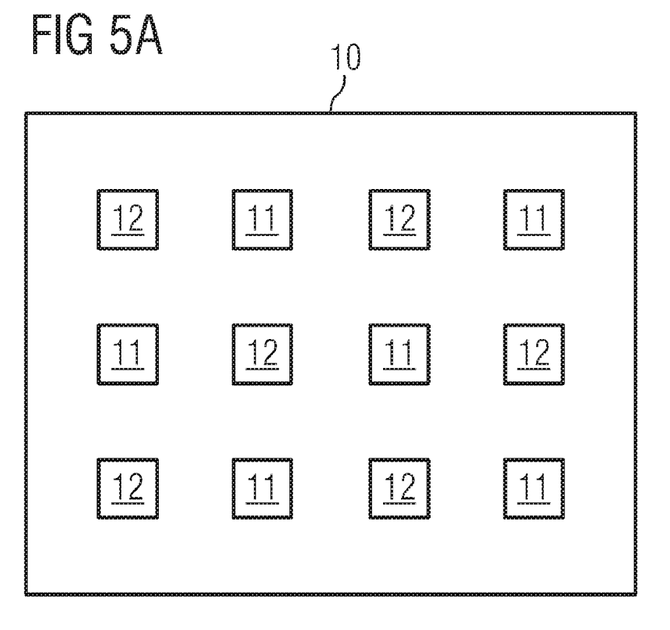
FIGS. 5A to 5D schematically illustrate an exemplary embodiment of a method to fabricate a device.
Figure 5B:
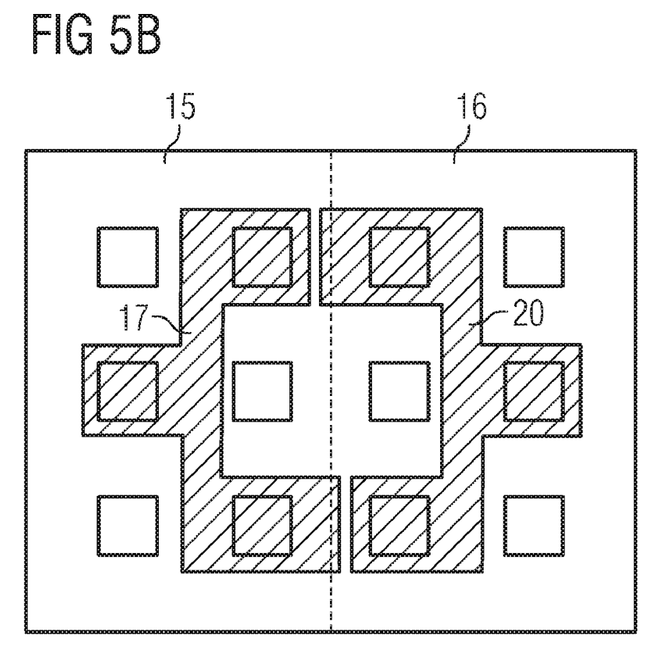
Figure 5C:
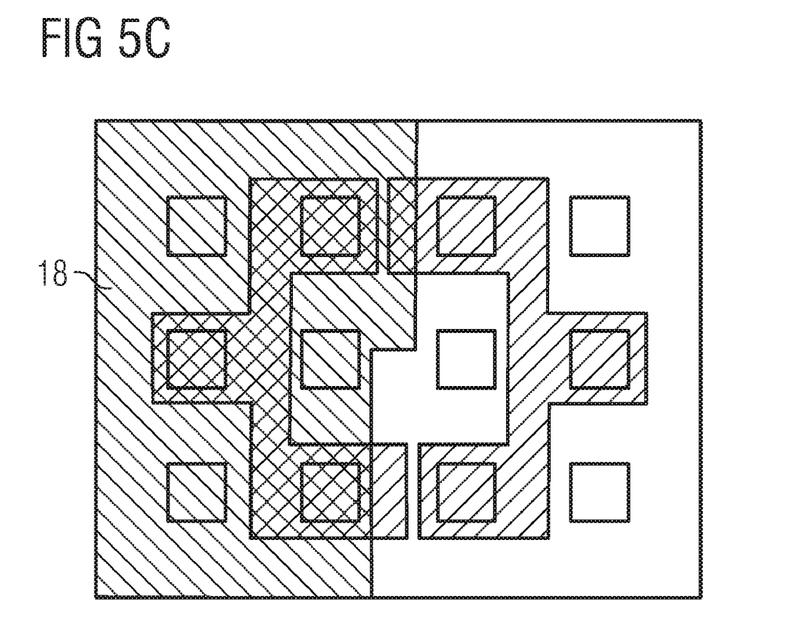
Figure 5D:
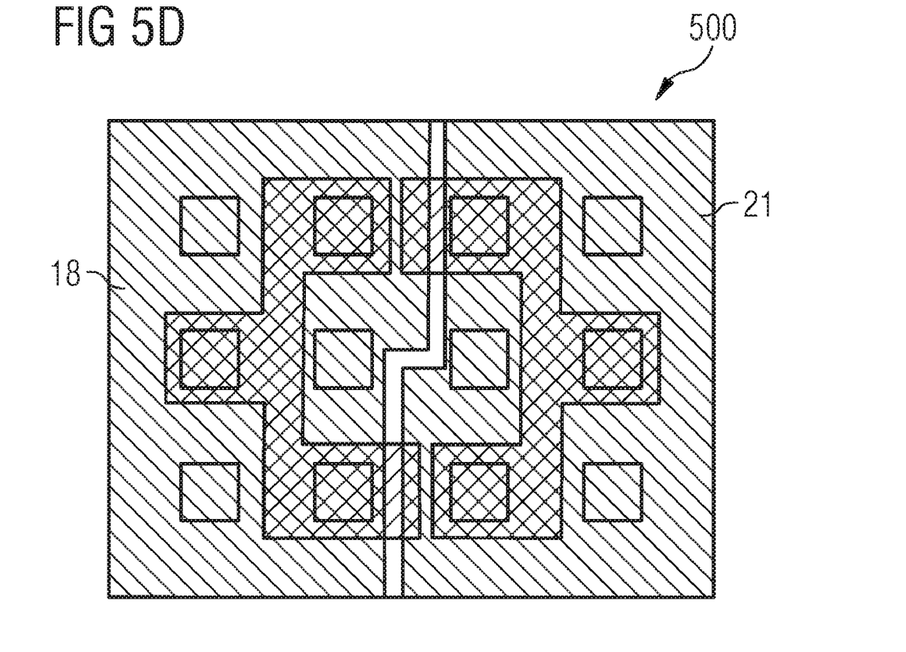

In FIGS. 5A to 5D different stages of the fabrication of a device 500, which is illustrated in FIG. 5D, are exemplarily illustrated. The fabrication method illustrated in FIGS. 5A to 5D is a variation of the fabrication method illustrated in FIGS. 2A to 2F. In contrast to the method of FIGS. 2A to 2F, in the present embodiment the electrically conductive layers 17 and 20 only cover parts of the sections 15 and 16 of the first surface 13, respectively. Furthermore, the electrically conductive layers 17 and 20 of the device 500 are shaped differently from the electrically conductive layers 17 and 20 of the device 200. In the device 500, the electrically conductive layers 17 and 20 are shaped such that no through-holes are necessary to connect the electrically conductive layers 18 and 21 to the second and first electrodes 12 and 11, respectively.

In addition, while a particular feature or aspect of an embodiment may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other.

Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A device, comprising:
    a semiconductor chip having a plurality of first electrodes and a plurality of second electrodes arranged on a first surface of the semiconductor chip;
    a first electrically conductive layer applied over a first section of the first surface and electrically coupled to the first electrodes arranged within the first section;
    a second electrically conductive layer applied over the first electrically conductive layer and electrically coupled to the second electrodes arranged within the first section;
    a third electrically conductive layer applied over a second section of the first surface and electrically coupled to the second electrodes arranged within the second section; and
    a fourth electrically conductive layer applied over the third electrically conductive layer and electrically coupled to the first electrodes arranged within the second section, wherein the second electrically conductive layer is electrically coupled to the third electrically conductive layer, wherein the first electrically conductive layer is electrically coupled to the fourth electrically conductive layer, wherein a surface of the fourth electrically conductive layer opposite the third electrically conductive layer comprises an external contact surface for electrical connection to the first electrodes of both the first and second sections, and wherein a surface of the second electrically conductive layer opposite the first electrically conductive layer comprises another external contact surface for electrical connection to the second electrodes of both the first and second sections.

2. The device of claim 1, wherein the second electrically conductive layer has an exposed surface which is larger than 1 mm$^2$.

3. The device of claim 1, wherein the first electrically conductive layer comprises through-holes and the second electrically conductive layer is electrically coupled to the second electrodes via the through-holes.

4. The device of claim 1, wherein the third electrically conductive layer comprises through-holes and the fourth electrically conductive layer is electrically coupled to the first electrodes via the through-holes.

5. The device of claim 1, comprising wherein the first electrically conductive layer is electrically insulated from the second electrically conductive layer.

6. The device of claim 1, comprising wherein the semiconductor chip has a plurality of control electrodes, which are arranged on the first surface of the semiconductor chip.

7. The device of claim 1, comprising wherein the semiconductor chip is a lateral power semiconductor chip.

8. A device, comprising:
    a semiconductor chip having a plurality of first electrodes and a plurality of second electrodes arranged on a first surface of the semiconductor chip;
    a first electrically conductive layer applied over a first section of the first surface, covering the first and second electrodes arranged within the first section and electrically coupled to the first electrodes;
    a second electrically conductive layer applied over a second section of the first surface, covering the first and second electrodes arranged within the second section and electrically coupled to the second electrodes;
    a third electrically conductive layer arranged between the first surface and the first electrically conductive layer, covering the second electrodes arranged within the first section and leaving the first electrodes uncovered; and
    a fourth electrically conductive layer arranged between the first surface and the second electrically conductive layer, covering the first electrodes arranged within the second section and leaving the second electrodes uncovered, wherein the second electrically conductive layer is electrically coupled to the third electrically conductive layer, wherein the first electrically conductive layer is electrically coupled to the fourth electrically conductive layer, wherein a surface of the fourth electrically conductive layer opposite the third electrically conductive layer comprises an external contact surface for electrical connection to the first electrodes of both the first and second sections, and wherein a surface of the second electrically conductive layer opposite the first electrically conductive layer comprises another external contact surface for electrical connection to the second electrodes of both the first and second sections.

9. The device of claim 8, comprising wherein at least one of the first electrically conductive layer and the second electrically conductive layers has an exposed surface which is larger than 1 mm$^2$.

10. The device of claim 8, wherein the first electrically conductive layer is electrically insulated from the second electrodes.

11. The device of claim 8, wherein the semiconductor chip is a lateral power semiconductor chip.

12. A device, comprising:
    a lateral power semiconductor chip having a plurality of first electrodes and a plurality of second electrodes arranged on a first surface of the lateral power semiconductor chip;
    a first electrically conductive layer applied over a first section of the first surface and electrically coupled to the first electrodes arranged within the first section;
    a second electrically conductive layer applied over the first electrically conductive layer and electrically coupled to the second electrodes arranged within the first section;
    a third electrically conductive layer applied over a second section of the first surface and electrically coupled to the second electrodes arranged within the second section; and
    a fourth electrically conductive layer applied over the third electrically conductive layer and electrically coupled to the first electrodes arranged within the second section, wherein the second electrically conductive layer is electrically coupled to the third electrically conductive layer, wherein the first electrically conductive layer is electrically coupled to the fourth electrically conductive layer, wherein a surface of the fourth electrically conductive layer opposite the third electrically conductive layer comprises an external contact surface for electrical connection to the first electrodes of both the first and second sections, and wherein a surface of the second electrically conductive layer opposite the first electrically conductive layer comprises another external contact surface for electrical connection to the second electrodes of both the first and second sections.

13. A method, comprising:
providing a semiconductor chip having a plurality of first electrodes and a plurality of second electrodes arranged on a first surface of the semiconductor chip;
depositing a first electrically conductive layer over a first section of the first surface and onto the first electrodes arranged within the first section;
depositing a second electrically conductive layer over the first electrically conductive layer and onto the second electrodes arranged within the first section;
depositing a third electrically conductive layer over a second section of the first surface and onto the second electrodes arranged within the second section; and
depositing a fourth electrically conductive layer over the third electrically conductive layer and onto the first electrodes arranged within the second section, wherein the second electrically conductive layer is electrically coupled to the third electrically conductive layer, wherein the first electrically conductive layer is electrically coupled to the fourth electrically conductive layer, wherein a surface of the fourth electrically conductive layer opposite the third electrically conductive layer comprises an external contact surface for electrical connection to the first electrodes of both the first and second sections, and wherein a surface of the second electrically conductive layer opposite the first electrically conductive layer comprises another external contact surface for electrical connection to the second electrodes of both the first and second sections.

14. The method claim 13, comprising forming through-holes in the first electrically conductive layer before the deposition of the second electrically conductive layer.

15. The method of claim 13, comprising depositing the first electrically conductive layer and/or the second electrically conductive layer galvanically.

16. The method of claim 13, comprising:
providing the semiconductor chip as part of a semiconductor wafer; and
singulating the semiconductor chip from the semiconductor wafer after the deposition of the second electrically conductive layer.

17. The method of claim 13, comprising wherein the semiconductor chip is a power transistor or a power diode or an IGBT.

* * * * *